United States Patent
Michiels et al.

(10) Patent No.: US 9,950,498 B2
(45) Date of Patent: Apr. 24, 2018

(54) ENERGY-SHIELDING PLASTICS FILM

(75) Inventors: Luc Michiels, Zele (BE); Bart Michiels, Zele (BE)

(73) Assignee: Michiels Group, Waasmunster (BE)

( * ) Notice: Subject to any disclaimer, the term of this patent is extended or adjusted under 35 U.S.C. 154(b) by 806 days.

(21) Appl. No.: 13/993,759

(22) PCT Filed: Dec. 13, 2011

(86) PCT No.: PCT/IB2011/055641
§ 371 (c)(1),
(2), (4) Date: Aug. 29, 2013

(87) PCT Pub. No.: WO2012/080951
PCT Pub. Date: Jun. 21, 2012

(65) Prior Publication Data
US 2013/0330570 A1    Dec. 12, 2013

(30) Foreign Application Priority Data
Dec. 13, 2010  (BE) .................................. 2010/0736

(51) Int. Cl.
*B32B 15/08* (2006.01)
*C23C 14/20* (2006.01)
(Continued)

(52) U.S. Cl.
CPC ................ *B32B 15/08* (2013.01); *B32B 7/12* (2013.01); *B32B 27/36* (2013.01); *B32B 38/08* (2013.01);
(Continued)

(58) Field of Classification Search
CPC ........... B32B 7/12; B32B 15/08; B32B 27/36; B32B 2250/02; B32B 38/08; B32B 15/082; B32B 15/085; B32B 15/088; B32B 15/09; B32B 15/092; B32B 15/095; B32B 15/098; B32B 17/10174; B32B 17/1022; B32B 17/1055; B32B 7/04; B32B 7/14; B32B 27/00; B32B 18/00; B32B 17/06; B32B 17/061; B32B 17/10; C23C 30/00; C23C 28/00; C23C 14/34; C23C 14/20; C23C 14/35; C23C 14/205; Y10T 428/31678;
(Continued)

(56) References Cited

U.S. PATENT DOCUMENTS

2005/0134959 A1 * 6/2005 Simpson ................. B32B 17/10
359/359

* cited by examiner

*Primary Examiner* — Michael E La Villa
(74) *Attorney, Agent, or Firm* — Jerold I. Schneider; Schneider Rothman Intellectual Property Law Group, PLLC (57) ABSTRACT

A plastics film with improved energy-shielding properties, suitable for application on a transparent or translucent surface, such as glass, and which is at least 50% transparent for visible light, further characterized in that it includes at least one plastic carrier layer with on top thereof as a functional layer a metallic layer consisting of antimony and/or arsenic together with indium and/or gallium, wherein the plastics film contains a total of indium (In), gallium (Ga), antimony (Sb) and arsenic (As) together, which are present as an alloy, such as indium andmonide, gallium andmonide, indium arsenide, indium gallium arsenide and/or gallium arsenide, of at least 4.0 ppm by weight and at most 25.0 ppm by weight. A glass plate to which the film is attached, is described as are objects provided with the glass plate. Methods are described for the production of the film, the glass plate and the objects.

34 Claims, 1 Drawing Sheet

(51) Int. Cl.
*C23C 14/34* (2006.01)
*C23C 28/00* (2006.01)
*C23C 30/00* (2006.01)
*B32B 7/12* (2006.01)
*B32B 27/36* (2006.01)
*H05K 9/00* (2006.01)
*B32B 38/08* (2006.01)
*C23C 14/35* (2006.01)

(52) U.S. Cl.
CPC ............ *C23C 14/20* (2013.01); *C23C 14/205* (2013.01); *C23C 14/34* (2013.01); *C23C 14/35* (2013.01); *C23C 28/00* (2013.01); *C23C 30/00* (2013.01); *H05K 9/0094* (2013.01); *B32B 2250/02* (2013.01); *Y10T 428/12556* (2015.01); *Y10T 428/12569* (2015.01); *Y10T 428/12681* (2015.01); *Y10T 428/12819* (2015.01); *Y10T 428/12944* (2015.01); *Y10T 428/261* (2015.01); *Y10T 428/265* (2015.01); *Y10T 428/266* (2015.01); *Y10T 428/268* (2015.01); *Y10T 428/28* (2015.01); *Y10T 428/2804* (2015.01); *Y10T 428/31678* (2015.04)

(58) Field of Classification Search
CPC ........... Y10T 428/266; Y10T 428/2804; Y10T 428/12556; Y10T 428/265; Y10T 428/12569; Y10T 428/12681; Y10T 428/12819; Y10T 428/12994; Y10T 428/261; Y10T 428/268; Y10T 428/28; Y10T 428/12944
See application file for complete search history.

US 9,950,498 B2

ENERGY-SHIELDING PLASTICS FILM

CROSS-REFERENCE TO RELATED APPLICATIONS

This application is the entry into the United States of PCT Application No. PCT/IB2011/055641 filed Dec. 13, 2011 and claims priority from Belgian Patent Application No. 2010/0736 filed Dec. 13, 2010, the entirety of each of which are hereby incorporated by reference.

The invention is related to making transparent or translucent surfaces less energy-transmitting, such as glass surfaces of vehicles or buildings. More in particular the invention is directed to an improved light-transmitting plastics film which can be applied onto such surfaces. The invention is further directed to the use and a method for the production of these plastics film, as well as to the use of specific materials for making a transparent plastics film energy-shielding.

BACKGROUND OF THE INVENTION

Thermal insulating of surfaces, for example in vehicles and buildings, has become widespread as a result of the growing request of humans for more living comfort, including a better temperature control of its direct environment, accompanied by a growing notion that the energy needed for said climate control is deemed to be scarce, and also contributes to the greenhouse effect, and therefore to the ecological footprint or carbon footprint of the user. Hence, for such reasons, there is a permanent request for reducing the necessary capacity to heat and/or cool the direct environment of humans, mainly in vehicles and buildings, mainly large buildings. such as office buildings.

Thermal insulating non-transparent parts of such surfaces, such as walls and partitions, has already become a standard practice in most circumstances. The energy exchange between the exterior environment with an interior environment, such as a passenger compartment of a vehicle, or the interior of a house, office or other building, occurs in most cases for by far the largest part through the transparent or translucent surfaces, such as through windows and other glazings.

For increasing the thermal insulation of glazings or other transparent surfaces, solutions have are already been offered, among which for example double or even triple glazing including one or more layers of air as insulation. In addition, this also offers an increased sound insulation, as well as a reduced risk for unwanted and possibly disturbing and/or detrimental condensation of moisture on the inside of the glass. However, these solutions are technically very radical and expensive in comparison with the nevertheless rather limited insulating effect achieved by it. Because the brightness of the view and the colour deviation of the transparent glazings is of primary importance, the insulating effect of those additional layers of glass is mainly achieved by reducing the heat conduction or conduction. The use thereof in vehicles is still uncommon.

It is found that, especially in vehicles and in buildings with large glass surfaces, still an undesirably high energy absorption may occur with a large incidence of sunlight, and alternatively, that an excessive high heat loss may occur from the inside to the outside at night, during the colder seasons, and through glazings with less or no incidence of sunlight. With the modern glazings, this energy exchange with the environment mainly occurs through radiation. This radiation energy occurs as visible light, in the relatively narrow visible range of wavelengths of about 380 to about 780 nanometer (nm), but also as ultraviolet (UV) radiation in the range of the shorter wavelengths of 280 to 380 nm and as infra-red (IR) radiation in the even wider range of the longer wavelengths up to about 1 mm.

Still, there remains the need to make transparent or translucent surfaces even more energy-shielding, such as glazings, mainly by influencing the radiation energy transmitted through such surfaces. It is thereby often undesirable that this should occur at the expense of a considerable reduction of the visible light that is been transmitted, mainly from the outside to the inside, for example in order to need to use less artificial light during daytime, or of an important change of the colour perception through such surfaces, as this is less appreciated by the user.

To make translucent surfaces, such as glass, more energy-shielding, energy-shielding plastics films have been developed, which try to absorb as selectively as possible the radiation from the range, not visible to the eye, but either the detrimental UV (A&B) range or the heat-generating IR (A, B &C) range. The infra-red radiation range is commonly divided into, on the one side, the near-infrared radiation range, N-IR or IR A&B, up to a wavelength of about 2500 nm, and the long-wavelength IR range, covering the range to 50,000 nm or 50 µm, and according to some authors up to and including 1 mm. Since solar radiation carries a lot of radiation energy with wavelengths in the near-IR range, technological improvements have mostly focused thereon. Hence, films have been developed which have a better infra-red absorption function, which provides a more even heat distribution and a more pleasant interior temperature at a high incidence of light. A disadvantage of these films is that the absorbed radiation is converted into heat in the film. Hence, this absorption may cause local temperature increases, which are passed on onto the substrate on which the film has been applied. With many substrates, such as glass, such local temperature increases lead to a high stress, and even may lead to glass breakage. A second disadvantage is that the absorbed heat, although transmitted to the interior in a more evenly manner, may still also locally cause a considerable temperature increase, which may still be perceived as unpleasant. Furthermore, transmission of this heat to the air leads to a loss of efficiency.

Hence, a high absorption of the incident solar energy does not lead to uncomplicated solutions. To limit or avoid these disadvantages as much as possible, films were developed with IR-reflecting properties, especially aimed at reflection in the near-IR radiation range. These films offer a reduction of the heat absorption of a vehicle or building equipped therewith in summer, such that cooling energy may be saved.

U.S. Pat. No. 6,797,396 describes a film transparent for visible light but reflecting infra-red light, and made from different polymer layers and which is metal-free. US 2008/0292820 A1 describes a multi-layered polymer film which has a haze value of at least 10% to further also control the sun-shielding properties by light diffusion. Metals may be incorporated in several successive metallic layers in the film, and they will cooperate as a Fabry-Perot interference filter to reflect the IR light and/or especially the so-called near-IR light. This is because solar radiation mainly appears in a wavelength range from 280 nm to 2500 nm. Until now, little or no attention has been given to the activity of long wavelength IR-C radiation energy.

US 2005/0134959 describes a UV-screening film which also reflects electromagnetic radiation, comprising a layer of silver. Additional layers may serve as a protective layer for the silver or may provide additional anti-reflection properties. Also WO 2007/009004 describes a film for screening electromagnetic radiation, comprising some metal and/or metal oxides. On the other hand, transparent semiconductors have been described as usable for saving energy, such as by C. Grandqvist, Transparent conductors as solar energy materials: A panoramic view, published in Solar Energy Materials and Solar Cells, Elsevier Science Publishers, Amsterdam, Part 91, 3 Jul. 2007, pages 1529-1598. However, the thickness of the layers used is still rather high. However, none of these documents mentions the use of antimony and/or arsenic in these applications.

However, the inventors have determined that, until now, a high degree of reflection has always been accompanied by a rather high degree of absorption, and that these reflecting films nevertheless still heat up by a rather high absorption of radiation energy. Although these films try to reflect as much radiation as possible, mainly in near-IR range, there is still a too high degree of absorption present in said range but also in the UV and in the long wavelength IR range, and as such, the problem of local heating associated therewith is still far from being solved.

For this reason, there remains a need for energy-shielding plastics films which reflect well, but at the same time heat up less by the incident radiation, and by the radiation energy absorbed there from over the full radiation range.

The object of the present invention is to reduce of solve the aforementioned problems, and/or to teach general improvements.

SUMMARY OF THE INVENTION

The invention provides an improved energy-shielding plastics film, a glass plate comprising said plastics film, and an object comprising said glass plate, as well as methods for the producing said objects and the use thereof.

For this purpose, the invention provides an energy-shielding plastics film, suitable for application on a transparent or translucent surface, such as glass, and which is at least for 50% transparent for visible light, meaning the wavelength range ranging from 380 to 780 nm and measured according to the standard NBN EN 410, characterized in that it comprises at least one plastic carrier layer with on top thereof, as a functional layer, a metallic layer comprising antimony and/or arsenic together with indium and/or gallium, wherein the plastics film contains a total of indium (In), gallium (Ga), antimony (Sb) and arsenic (As) together, which are present as an alloy, such as indium antimonide, gallium antimonide, indium arsenide, indium gallium arsenide and/or gallium arsenide, of at least 4.0 ppm by weight and at most 25.0 ppm by weight, wherein the concentrations are expressed relative with respect to the weight of the whole of the plastics film including all its layers, except for a protective film for an adhesive layer, if present.

The inventors have found that, when using at least one of these metallic components together with antimony and/or arsenic, at the prescribed low concentrations in a functional layer, an energy-shielding plastics film is obtained with a good light transmission and strong infra-red reflecting properties, and this in both directions and over the whole IR range, including the long wavelength IR-C radiation, but characterized by a surprisingly low degree of energy absorption. Therefore, this film remains surprisingly cool at incident radiation energies while other films with similar transmission properties warm up considerably. Therefore, the film unites, at an equal light transmission, a higher heat reflection with a lower heat absorption. This provides a considerable improvement with respect to the known films, which especially leads to a strongly reduced heating of the film itself, such that it can also be used on temperature-sensitive surfaces.

The inventors have determined that the prescribed concentrations of indium (In), gallium (Ga), antimony (Sb) and arsenic (As) together are clearly too low to form a continuous layer. Without being bound by theory, the inventors assume that the favourable effects obtained by the film according to the present invention are due to the way in which these selected materials are present in the metallic layer. The low concentration apparently ensures that the metals are present in the form of nanomolecular dots, i.e. in a nanomolecular dot structure, and that this structure probably makes an important contribution to the favourable properties of the film according to the invention. The inventors have determined that the film according to the present invention shows fluorescence behaviour at long wavelength UV light of about 366 nm. This dot structure may lead to light trapping, or a higher absorption at a smaller layer thickness. The inventors assume that thereby a part of the absorbed energy is converted into electrical energy, which disappears into the environment by dissipation without leading to local heating. This theory is explained in more detail in H. A. Atwater et al., in "Plasmonics for improved photovoltaic devices", Nature Materials, Vol. 9, Nr. 3, 1 Mar. 2010, Nature Publishing Group, pp. 205-213, including its Corrigendum in Vol. 9, Nr. 10, p. 865.

Moreover, the inventors have determined that a considerable part of the nevertheless still absorbed radiation energy is not converted into heat, irrespective of the wavelength thereof. Without being bound by this theory, the inventors suspect that the combination of metallic components according to the present invention this radiation energy, mainly IR-radiation, at least partly in a photovoltaic manner converts into electrical energy, such as in the form of a potential difference. This electrical energy is presumably redirected by the edges of the film into the environment without leading to local heating. The result is that the plastics film or plastics foil according to the present invention accumulates less heat due to its photovoltaic properties, than what can be expected by the measured absorption of radiation energy, which leads to a higher energetic efficiency, a higher ease of use, and less risk on glass breakage. The film according to the present invention may also be applied onto a much wider range of objects and/or glass types than the already known films, because of the lower heating and because those objects or glass surfaces become less sensitive to thermal breakage.

The film or foil according to the present invention is a sun-shielding and heat-insulating film with a high light transmission, coupled to a minimum of heat absorption and a high IR-reflection. The high IR-reflection is thereby offered in both directions, such that it offers advantages in moderate climate zones both in summertime and in wintertime. It showed hardly any, or no heat convection to the interior environment, which is beneficial for the g-value or solar gain. The g-value or solar gain is the sum of the energetically direct transmission factor, i.e. the sunlight that is transmitted, and of the indirect solar transmission, i.e. the part of the absorbed radiation energy that is directed towards the interior. In other words, it is the ratio of the total energetic capacity transferred to the interior environment relatively with respect to the total capacity of the incident solar radiation. The g-value is measured according to the standard NBN EN 410. Alternatively, in wintertime, it offers an advantage by keeping the heat radiation inside, and hence limiting energy loss by radiation to the outside environment.

An additional advantage is that the functional layer is built up of inorganic compounds, which are to be preferred because of their stability and therefore longer lifetime over organic photosensitive compounds or pigments.

Also, the inventors have determined that the film or foil according to the present invention has a high Ra-value of at least 90, and preferably of at least 95. The Ra-value is a measure or index for colour rendering, which equals 99—for comparison—for a 4 mm thick clear glass.

This offers the advantage that colour perception through glass provided with the film according to the present invention is not or only to a minimum extent influenced, which leads to a higher ease of use. The Ra-value is preferably measured according to the instructions of the standard NBN EN 410.

The film according to the present invention offers the further advantage of a high "Shielding Effectiveness" (SE), or more correctly called, damping factor, in the frequency range from 10 MHz to 1 GHz, of about 22 decibel (dB). This offers the advantage that the incoming and outgoing electromagnetic radiation in buildings. with mainly glass as exterior surfaces may be inhibited or damped with at least 15 and generally about 20 dB or even more. This provides a considerable advantage in the field of communication security, because as a result thereof, wireless communication and its applications, which more and more occur indoors, may be disrupted less easily or undesirably captured from outside, which i.e. considerably increases the privacy of these communications.

The invention further provides a method for producing the plastics film according to the present invention comprising a step for applying a metallic layer on the plastic carrier layer, preferably by vapour deposition or physical vapour deposition, more preferably by sputter deposition, and even more preferably by "DC magnetron sputtering deposition".

The invention further provides for the use of antimony and/or arsenic together with indium and/or gallium for rendering energy-shielding a transparent plastics film which is at least for 50% transparent for visible light, meaning the wavelength range ranging from 380 to 780 nm and measured according to the standard NBN EN 410, and wherein the plastics film contains a total of indium (In), gallium (Ga), antimony (Sb) and arsenic (As) together, which are present as an alloy, such as indium antimonide, gallium antimonide, indium arsenide, indium gallium arsenide and/or gallium arsenide, of at least 4.0 ppm by weight and at most 25.0 ppm by weight, wherein the concentrations are expressed relative with respect to the weight of the whole of the plastics film including all its layers, except for a protective film for an adhesive layer, if present. The invention also provides the use of a plastics film according to the present invention for energy-shielding transparent or translucent surfaces, such as a glass plate, and/or for reducing the risk on glass breakage.

DETAILED DESCRIPTION

The plastics film according to the present invention preferably comprises in a metallic layer antimony and/or arsenic, and indium and/or gallium, together with one other metal selected from the group consisting of antimony, tin, arsenic, aluminium, nickel, alloys and/or combinations thereof. Examples of suitable nickel alloys are those which belong to the Inconel family. The inventors have found that this additional metal and/or several metals from this group may also form metallic compounds with antimony and/or arsenic, or with indium and/or gallium, which provide a marked contribution to the effect of the present invention, in particular the reduced heating, to be explained by an reduced absorption and a reduced conversion of the absorbed radiation energy into heat.

The plastics film according to the present invention preferably comprises a metallic layer comprising a component selected from the list consisting of indium antimonide, gallium arsenide, indium gallium arsenide, indium arsenide, gallium aluminium arsenide, gallium antimonide, and combinations thereof. The inventors have determined that these components are particularly suitable for a combination of a high heat reflection with a low heat absorption, and optionally also for converting radiation energy into electrical energy, and as a result thereof, exceptionally favourably reduce the conversion in heat thereof.

The film according to the present invention is preferably applied to the inside of the transparent or translucent surfaces, because its lifetime is considerably higher than when exposed to all weather conditions on the outside. It can also be placed between position 2 and 3 of a double or a multiple glazing. In double and multiple glazing, the glass surfaces are conventionally numbered from the outside to the inside. Positioning the film according to the present invention between positions 2 and 3, more in particular if the film can be stretched in the space between the two glass plates, offers the additional advantage that the film divides the space between those two glass plates in two compartments, and inhibits convection of air or gas from one compartment into the other. In this way, the film additionally increases the heat insulation of the double glazing. The same effect can also be also achieved by providing a third glass plate in the middle between the two outer glass plates, but this requires a much larger total thickness of the glazing, and considerably increases the total weight of the glazing. Stretching the plastics film in the internal space of the double glazing may be performed with minimum or even without additional total thickness increase, and without little or no weight increase of the whole. Therefore, it avoids special provisions in windows and supporting elements, and therefore also offers additional advantages and possibilities for more energy-shielding and heat-insulating existing glazings. However, the film does not necessarily need to be stretched in the space between the glass plates of multiple glazing, but can also be laminated onto one of the glass surfaces. Preferably, the film according to the present invention is laminated in position 4, i.e. on the surface which faces in double glazing the inner glass plate towards the interior, but even more preferably, the film is laminated in position 3, i.e. on the surface which faces the inner glass plate in double glazing to the exterior.

The inventors have also considered that the metallic compositions may also directly be applied, for example by sputtering, onto the surfaces of the glass plates of the multiple glazing, preferably in position 3 of the double glazing.

Energy-shielding films or foils try to reflect the non-visible radiation energy as much as possible, and to transmit the visible light as undisturbed as possible. The infra-red (IR) radiation is mainly inhibited because it is converted into heat on the illuminated object. Ultraviolet radiation is mainly inhibited because it can be detrimental for the illuminated object, which often leads to a loss of the aesthetic aspects thereof.

The inventors prefer that the film according to the present invention is at least for 54% transparent for visible light, more preferably at least 57%, more preferably at least 60%, more preferably at least 62%, even more preferably at least 66%, even more preferably at least 70%. As stated, with transparency for visible light is meant here the transmission value of visible light within the wavelength range ranging from 380 to 780 nm, and measured according to the standard NBN EN 410. Preferably, the film according to the present invention has a high ratio of light transmission with respect to the achieved solar inhibition, predominantly achieved by reflection. According to the inventors, this can be influenced by an appropriate choice of metals and their respective light reflection capacity, and the amount of those respective metals incorporated in the film.

Preferably, the film according to the present invention has a low energetic absorption measured according to standard EN 410. Preferably, for a film according to the invention with a light transmission of about 70%, the factor of direct absorption of solar energy is at most 35%, more preferably at most 32%, even more preferably at most 30%, preferably at most 28%, even more preferably at most 26% or even at most 24%, preferably at most 22%. More preferably, the energetic absorption of the film is even lower, such as at most 20%, even preferably at most 18%, preferably at most 16%, but even lower values of at most 15% or 14%, and even less than 13.5%, such as 13.1% is achievable. These are very advantageous values, when compared with the energetic absorption of some clear glazing with a thickness of 6 mm, which amounts to about 12.3%, measured according to EN 410.

Furthermore, the inventors have determined that the reflection of the visible light within the wavelength range ranging from 380 to 780 nm, if desired, may even be further decreased by additional applying 1 or even 2 homogeneous metal oxide layers. Preferably, these metal oxide layer or layers are applied onto the surface of the metallic layer according to the present invention. Applied on a metallic layer according to a preferred embodiment of the present invention which itself consists of three layers, as explained below, with said layers numbered from 1 to 3 starting on the side which faces the sunlight, optionally, to the outside of layer 1 a metal oxide layer 4 can be applied and/or to the outside of layer 3 a metal oxide layer 5 can be applied. Preferably, layer 4 and/or layer 5 contain one or more oxides with a high refractive index. Preferably, the metal oxides are selected independently of each other from the list of zinc oxide (ZnO), titanium dioxide ($TiO_2$), tin dioxide ($SnO_2$), silicon dioxide ($SiO_2$), indium tin oxide (ITO), dibismuth trioxide ($Bi_2O_3$) and combinations thereof. Preferably, these layers have each independently a thickness of preferably in the range of 20-50 nm, more preferably 30-40 nm, and even more preferably about 35 nm. According to this embodiment, only one of the metal oxide layers 4 and 5 may be applied, but the inventors preferably apply both layers 4 and 5, hence sandwiching the metallic layer according to the present invention.

When measuring spectral properties, such as transmission and reflection as a function of wavelength, and hence inclusive transparency for visible light, we prefer using an arrangement consisting of a spectrophotometer of the type "Perkin-Elmer Lambda 900 UV-VIS-NIR", preferably equipped with a double beam and double monochromator. We prefer a spectrophotometer which is equipped with an integrating sphere of 150 mm of the type Perkin-Elmer PELA 1000. The measurements are preferably carried out at a perpendicular (0°) angle of radiation on the material to be tested.

In accordance with NBN EN 410, transmission and reflection of sunlight through a transparent surface can be measured. The absorption is that part of the energy in the sunlight that is not transmitted or reflected. The inventors have determined that the film according to the present invention has a very low energetic absorption according to EN 410. Hence, a film with a transmission in the visible light gives a transmission of about 70% when applied onto 3 mm thick single glass, preferably an absorption of at most 35%, more preferably at most 30%, even more preferably at most 26%, more preferably at most 24% and even more preferably at most 22% of the energy in the sunlight within the wavelength range of 280 to 2500 nm.

The advantage of the film according to the present invention is that it reflects a large part of the IR spectrum radiation, i.e. also the long wavelength infrared-C radiation. In summertime, the solar heat is mainly transmitted by the near-IR light of the sun (IR-A&B radiation—with wavelengths from 780 nm to 2500 nm). Therefore, it is important that the film reflects this IR-A&B radiation to offer good sun-shielding properties during summertime. As soon as sunlight illuminates an object, much of the radiation energy thereof is converted into long wavelength heat. All the heat generated in a house or a vehicle is also long wavelength heat, mainly in the long wavelength IR-C range, with typical wavelengths of 2500 to 50000 nm. Because the film according to the present invention reflects also this IR-C radiation, it limits also heat loss by the windows during wintertime. In both cases it leads to a more pleasant room temperature, and to savings in energy necessary both for cooling in summertime and for heating in wintertime.

In one embodiment, the plastics film comprises at least one additional metal, as metal, metal alloy, metal oxide or another metal compound, whereby the metal is selected from the list of metals which appear in the IUPAC periodic table of the elements, the version of 22 Jun. 2007 and wherein the element groups are numbered from 1 up to and including 18, in the groups indicated with numbers 3, 4, 5, 6, 10, 11, 12, 13 and 15, and preferably the metal being selected from the list consisting of silver (Ag), chromium (Cr), nickel (Ni), zinc (Zn), and combinations thereof, whereby the additional metal is preferably comprised in the metallic layer, which metallic layer either forms one homogeneous layer, or is made up of two or more metallic sublayers with a different composition.

The inventors have determined that with the choice of metal or metals, the absorption and/or reflection properties of the film can be influenced and optionally adjusted. The inventors have found that silver (Ag), chromium (Cr), nickel (Ni), arsenic (As) and antimony (Sb) may have a reducing effect on the IR-absorption capacity, but an increasing effect on the IR-reflection capacity of the film. On the contrary, zinc (Zn) and indium (In) were found to have an increasing effect on the IR-absorption capacity, wherein zinc (Zn) may have a reducing effect and indium (In) may have an increasing effect on the IR-reflection capacity of the film.

The inventors have also determined that the film according to the present invention, when it contains silver (Ag), shows a selective photochrome effect, i.e. it transmits less light at a high incidence angle and hence, absorbs more energy than at a lower light incidence angle. This offers the additional advantage that the energy-shielding function of the film is higher at a higher incidence angle, and hence, also at a high light intensity such as when the sun is at a high position in the sky and/or full sunlight incidence, such as at noon, but that it starts transmitting more light at a lower incidence angle and hence, a lower light intensity, for example when the sun is at a low position in the sky in the morning and in the evening, when the incidence of the sunlight can be less annoying and even desirable. This is especially advantageous because the glazings, which are temporarily exposed to more intense sunlight because of their orientation with respect to the sun, will transmit less energy than other glazings, and when the incidence angle of the sunlight becomes smaller again, will become more transparent for visible light.

The inventors have also found that, despite the predominantly IR-reflection character of the film or foil according to the present invention, it gives no or not often unpleasant light reflections in the visible range. This increases the convenience for the user. The inventors found that this inconvenience can be avoided or limited by adequate limiting the amount of metals that are incorporated in the film, such as explained in more detail below.

The thickness of the metal layer may vary within very wide limits. In one embodiment of the plastics film according to the present invention, the metallic layer has a thickness of at least 50 Angstrom or 5 nm, preferably at least 8 nm, more preferably at least 12 nm, and which in addition optionally amounts to at most 50 nm, preferably at most 40 nm and more preferably at most 30 nm. Typically, the metal layer has a thickness within the range of 14 to 22 nm, preferably 17 to 20 nm. The inventors have found that these layer thickness is sufficient to obtain the desired positive properties and effects, but at the same time is not too high to reduce the light transmission too much. The inventors prefer to use within these limits a dosage of metals as low as possible, because these metals are rather scarce and a higher concentration and use thereof leads to a higher cost of the film.

In an embodiment, the metal layer in the film according to the present invention comprises three layers, numbered 1 to 3, starting at the side which is directed to the sunlight. Layer 2 preferably contains silver (Ag). Layer 2 may preferably contain sufficient silver to form a continuous layer, in contrast to layers 1 and/or 3, which preferably contain indium, gallium, antimony and/or arsenic, but in concentrations insufficient to form a continuous layer. Layer 2 is embedded between the two metal layers 1 and 3. Layer 1 preferably contains indium (In) and/or gallium (Ga), together with antimony (Sb), preferably also indium with antimony, and preferably as indium antimonide. Also layer 3 can be provided with the same metals as proposed for layer 1, and this either as an alternative for layer 1, or simultaneously with a layer 1 which comprises these metals.

In an embodiment of the present invention, the film provides a damping factor for electromagnetic radiation of about 20 to 22 decibels (dB), and spanning the frequency range from 10 MHz to 1 GHz. A damping of 20 dB causes a reduction of the field strength of a signal of 90%, and a reduction of the signal capacity of 99%. Hence, these values are considerable. In addition, it is particularly advantageous that this damping factor is about the same, irrespective of the frequency of the electromagnetic radiation or of the signal. Therefore, the film dampens about to the same extent both the AM midwave radio signals (>1 MHz), the public Citizen Band signals (>27 MHz), the FM radio signals (>100 MHz), the mobile communication signals reserved for the public services (100-150 MHz), the lower VHF TV signals (150-550 MHz), the public shortwave communication signals (about 433 MHz), the higher UHF TV signals (600-800 MHz), all conventional GSM signals (respectively 900 and 1800 MHz), and the public short distance Blue Tooth communication signals (2400-2500 MHz). This listing only gives the publicly known signal frequencies. The film will however likewise also dampen the signals in frequency ranges not released for the public, which are reserved by the government for itself.

Stone walls and reinforced concrete already offer a damping factor of about 20 dB. However, it is important for a good screening of an installation, that all components dampen to about the same extent the signal strength. The film according to the present invention has a damping factor which is about just as high as for other commonly used construction materials. It is therefore an considerable advantage that such damping factor can now be obtained with the existing glazings, by applying the film according to the present invention. Hence, the film according to the present invention may contribute to a higher security of sensitive electronic equipment indoors against possibly mala fide wireless influence from outside, such as by electromagnetic interference, but also to a security of sensitive wireless communication indoors, which cannot, or only with more difficulties be detected from within a considerable smaller perimeter around the buildings. This high damping of electromagnetic radiation allows to use this film as part of a so-called "zoning" concept. With these films, very easy and cheap "unsafe zones" may be converted into so-called "safe zones", much easier and cheaper than with conventional techniques, such as building a Faraday cage. Because of this high damping, the film according to the invention also offers a good protection against radiation pollution and possible health problems which could possibly be assigned to the exposure to higher electromagnetic radiation.

In an embodiment of the plastics film according to the present invention, the metallic layer is on its free side protected with an additional plastic embedding layer. This offers the advantage that the metallic layer is protected against external physical and/or chemical effects. Preferably, this embedding layer is applied by laminating, under the influence of temperature and pressure, the carrier layer on the side of the metal layer with a plastics layer, preferably manufactured from a thermoplastic plastics. Optionally, the embedding layer can be glued by means of an adhesive layer which is applied before the embedding layer is glued. Such adhesive layer is preferably made on the basis of (meth) acrylic acid or derivatives thereof and has a typical thickness of about 1.5 µm.

In an embodiment of the plastics film according to the present invention, the plastics carrier layer and/or the plastics embedding layer, if present, have a thickness of 10-50 µm, preferably 15-30 µm, more preferably 20-25 µm, and most preferably about 22 or 23 µm. Preferably, the whole film has a thickness of 35-60 µm. The inventors have found that these layer thicknesses are sufficient to provide the desired mechanical properties, without considerably reducing the optical properties, such as the light transparency.

In an embodiment of the present invention, the plastics film is on one side provided with an adhesive layer, preferably comprising a water-activatable or pressure-sensitive adhesive, more preferably an adhesive which is made on the basis of (meth)acrylic acid or derivatives thereof. This adhesive layer typically also has a thickness of about 1.5 µm. This adhesive layer serves to easily apply the film onto a substrate, such as glass. The pressure-sensitive or water-activatable adhesive is preferred because of the ease of use when applying the film on the substrate. The inventors further prefer that this adhesive layer is covered with a plastics protective film, which is preferably based on a polyester, more preferably on polyethylene terephthalate (PET). This protective film or stripping layer protects the adhesive layer, possibly already during the further production process of the film, and also during transport and storage. This protection can be also handy when cutting out the film to adapt it to the surface on which it needs to be applied, and it makes introducing the film on the substrate extremely easy.

In a further embodiment, the plastics film according to the present invention is provided on one side, in the presence of an adhesive layer on the side other than the side on which the adhesive layer is present, with a plastics protection layer, preferably a hard and/or scratch-resistant cover layer, more preferably a plastics layer based on a polyacrylic or a polyurethane plastic. This protection layer is preferably based on a scratch-resistant material. This provides the advantage that the film is less easily mechanically damaged, as a result of which light would be scattered and the optical and aesthetic properties would be negatively influenced. Dispersion of the radiation due to damages to the film may also lead to a loss of efficiency of the film. The protection layer restricts these disadvantages to a minimum. Preferably, this protection layer is also resistant against chemicals, which offers the additional advantage that the film is washable. This also benefits the long term optical and aesthetic effect, at proper maintenance.

In an embodiment of the plastics film according to the present invention, the plastics for the carrier layer and/or the embedding layer is based on a transparent thermoplastics material, more preferably a material selected from the list consisting of polyethylene (PE), polypropylene (PP), polyvinyl chloride (PVC), polyvinyl alcohol (PVA), polyesters, polyacrylic resins, polystyrene resins, polyamides, and combinations thereof. The inventors have determined that these materials are extremely suitable to achieve the desired mechanical and optical properties of the film.

In further embodiment, the plastics film contains indium and/or gallium at a concentration of at least 1.0 ppm by weight, preferably at least 1.5 ppm by weight, more preferably at least 2.0 ppm by weight, preferably at least 2.5 ppm by weight, and optionally at most 15 ppm by weight, preferably at most 10.0 ppm by weight, more preferably at most 7.0 ppm by weight or even at most 5.0 ppm by weight, more preferably at most 4.0 ppm by weight, and even more preferably at most 3.0 ppm by weight, and these concentrations are hereby expressed relative with respect to the weight of the whole of the plastics film including all its layers, except for the protective film for the adhesive layer, if present. The inventors have found that these concentrations are sufficient to achieve the desired effect, and that higher concentrations offer no significant further advantages but especially increase the cost of the film.

In a further embodiment of the plastics film according to the present invention, said film satisfies at least one of the following features, and preferably more than one, and more preferably all of the following features:

(i) comprising silver (Ag) at a concentration of at least 5 ppm by weight, preferably at least 10 ppm, more preferably at least 15 ppm by weight, more preferably at least 20 ppm by weight, even more preferably at least 30 ppm by weight, and optionally at most 100 ppm by weight, preferably at most 70 ppm by weight, more preferably at most 60 ppm by weight, even more preferably at most 50 ppm by weight, even more preferably at most 40 ppm by weight, (ii) comprising chromium (Cr) at a concentration of at least 0.50 ppm by weight, preferably at least 1.00 ppm by weight, preferably at least 1.30 ppm by weight, more preferably at least 1.60 ppm by weight, and optionally at most 30 ppm by weight, preferably at most 25 ppm by weight, more preferably 20 ppm by weight, preferably at most 15 ppm by weight, more preferably at most 10.0 ppm by weight, (iii) comprising nickel (Ni) at a concentration of at least 10 ppm by weight, preferably at least 15 ppm by weight, preferably at least 18.00 ppm by weight, and optionally at most 50 ppm by weight, preferably at most 40 ppm by weight, more preferably at most 30 ppm by weight, even more preferably at most 25.0 ppm by weight, (iv) comprising zinc (Zn) at a concentration of at least 0.50 ppm by weight, preferably at least 1.00 ppm by weight, preferably at least 2.00 ppm by weight, more preferably at least 3.00 ppm by weight, and optionally at most 30 ppm by weight, preferably at most 20 ppm by weight, preferably at most 18.00 ppm by weight, and/or (v) comprising antimony (Sb) and/or arsenic (As) at a concentration of at least 3.00 ppm by weight, preferably at least 4.00 ppm by weight, more preferably 5.00 ppm by weight, more preferably at least 5.50 ppm by weight, preferably at least 6.00 ppm by weight, and even more preferably at least 6.50 ppm by weight, and optionally at most 15 ppm by weight, preferably at most 12 ppm by weight, more preferably at most 10 ppm by weight, even more preferably at most 9.0 ppm by weight, preferably at most 8.50 ppm by weight, more preferably at most 8.00 ppm by weight, and even more preferably at most 7.50 ppm by weight, wherein the concentrations are expressed relative with respect to the weight of the whole of the plastics film including al its layers, except for the protective film of the adhesive layer, if present. The inventors have found that these concentrations are sufficient to achieve the desired effect, and that higher concentrations offer no significant further advantages but especially increase the cost of the film.

In an embodiment of the present invention, the plastics film contains a total of indium (In), gallium (Ga), antimony (Sb) and arsenic (As), which are optionally present as alloy, such as indium antimonide, gallium antimonide, indium arsenide, indium gallium arsenide and/or gallium arsenide, of at least 4.0 ppm by weight, preferably at least 5.0 ppm by weight, more preferably at least 6.0 ppm by weight, preferably at least 7.0 ppm by weight, more preferably at least 8.0 ppm by weight, more preferably at least 9.0 ppm by weight, and at most 25.0 ppm by weight, preferably at most 22.0 ppm by weight, more preferably at most 20.0 ppm by weight, preferably at most 18.0 ppm by weight, more preferably at most 15.0 ppm by weight, even more preferably at most 13.0 or only 12.0 ppm by weight, preferably at most 11.0 ppm by weight, and more preferably at most 10.5 ppm by weight. Also these concentrations are expressed relative with respect to the weight of the whole of the plastics film including all its layers, except for the protective film of the adhesive layer, if present.

In an embodiment of the present invention, the plastics film contains a total of metals in a concentration of at most 250 ppm by weight, preferably at most 200 ppm by weight, more preferably at most 150 ppm by weight, preferably at most 100 ppm by weight, expressed with respect to the weight of the whole of the plastics film including all its layers, except for the protective film of the adhesive layer, if present. In this context, a metal is defined as a chemical element from the periodic table of the elements, selected from the groups of transition metals and main group metals, and which are located in said periodic table of the elements to the left of the semi-metals or metalloids, which are located on a diagonal line from boron (B) to astatium (At). Preferably, in this context, the total metal concentration is determined with the exclusion of the alkali metals and the alkaline earth metals. The inventors prefer to restrict the total of metals such that it results in a high transparency and a high transmission of visible light. By the appropriate choice of the metals in view of their light reflection capacity, and by limiting the total metal concentration, it was nevertheless found that a high solar inhibition could be achieved, together with a high transmission of visible light and a limited energy absorption, preferably also a limited conversion of the adsorbed energy into heat generation. In this way, the film according to the present invention also does not lead to a more intensive use of artificial light indoors during daytime.

The present invention also provides a glass plate or other transparent or translucent object, or also non-translucent surfaces if these are flat, with applied thereon, preferably glued, the plastics film according to any one of the previous claims. The film according to the present invention is particularly suitable in combination with highly transparent glass. These objects enjoy the improved energy-shielding properties and the other advantages which are offered by the plastics film according to the present invention, mainly the lower heating and/or the damping of electromagnetic radiation.

Furthermore, the present invention provides an object comprising a glass plate according to the present invention, preferably an object selected from the group consisting of a vehicle, a vessel, and a building. The advantage is that the interior environment of these objects is more pleasant for humans, and that the living comfort in these interior environments can be controlled with a smaller use of energy, with a lower cost and a lower effect on the environment, such as the ecological footprint or carbon footprint of the user of that said interior environment.

The present invention also provides a method for the production of the plastics film according to the present invention which comprises the step of applying the metallic layer on the plastic carrier layer, preferably by vapour deposition or physical vapour deposition, more preferably by sputter deposition, and even more preferably by Direct Current (DC) magnetron sputtering deposition. Applying the metal layer is preferably done in three steps, wherein in each step one of the sublayers is applied.

Preferably, the method according to the present invention comprises further applying at least one additional metal, in the form of a metal, metal alloy, metal oxide or other metal compound, wherein the metal is selected from the list of metals which appear in the IUPAC periodic table of the elements, the version of 22 Jun. 2007 and wherein the element groups are numbered from 1 to and including 18, in the groups indicated with numbers 3, 4, 5, 6, 10, 11, 12, 13 and 15, and preferably the metal selected from the list consisting of silver (Ag), chromium (Cr), nickel (Ni), zinc (Zn), and combinations thereof and combinations thereof, preferably by vapour deposition or physical vapour deposition, more preferably by sputter deposition, and even more preferably by Direct Current (DC) magnetron sputtering deposition.

Preferably, the method according to the present invention further comprises laminating the embedding layer, preferably by using heat and pressure and/or by using an extra adhesive layer, on the metallic layer, and, if present, preferably together with the additional layer or layers including the additional metal, in the form of a metal, metal alloy, metal oxide or another metal compound selected according to the present invention.

The method according to the present invention preferably comprises at least one of the following steps, and preferably all of the following steps:
applying an adhesive layer, preferably to the outside of the carrier layer or of the embedding layer,
applying a stripping layer or protective film on the adhesive layer, and/or
applying a protective layer, preferably by spraying.

The method according to the present invention preferably comprises also:
if present, removing the stripping layer or protective film of the plastics film, and
sticking the plastics film on a translucent and/or transparent surface, preferably of a glass plate, more preferably of a highly transparent glass plate.

The method according to the present invention preferably further comprises the step of integrating the translucent and/or transparent surface, preferably the glass plate, in an object, preferably the object selected from the group of a vehicle, a vessel, and a building.

As already described above, the present invention further provides the use of antimony and/or arsenic together with indium and/or gallium for rendering energy-shielding a transparent plastics film with a transparency for visible light of at least 50%.

Preferably, this use comprises the use of one metal selected from the range consisting of tin, arsenic, aluminium, and combinations thereof.

More preferably, the present invention provides in the use, for energy-shielding a transparent plastics film with a transparency for visible light of at least 50%, of a component selected from the group consisting of indium antimonide, gallium arsenide, indium gallium arsenide, indium arsenide, gallium aluminium arsenide, gallium antimonide, and combinations thereof.

The present invention will now be illustrated with the following examples without being limited thereto.

Example 1

A plastics film 1 according to the present invention was produced in the following manner. The film consists, in the following order, of a transparent carrier layer with on one side a hard coat protection layer, and on the other side first a first metal layer, next a silver-containing layer, subsequently a third metal layer, on top of it an adhesive layer or adhesive, on top of it another embedding layer, followed by a second adhesive layer.

The production starts by applying the metallic layers on the plastics carrier layer using DC magnetron sputtering deposition. The carrier layer was manufactured from polyethylene terephthalate (PET), and had a thickness of about 23 μm. The indicated metal concentrations below are expressed in weight units, and are related to the weight of the total film, without the optionally existing stripping layer.

The first metal sublayer which was applied, comprised chromium (0.8 ppm), zinc (1.5 ppm), nickel (9.3 ppm) and indium antimonide (5.05 ppm). The first metal sublayer had a thickness of 11 to 15 Angstrom.

As second metal sublayer, a layer of silver was sputtered, at a concentration of 30.0 ppm, which had a thickness of 120 to 140 Angstrom. Subsequently, as third metal sublayer, a layer was sputtered including chromium (0.8 ppm), zinc (1.5 ppm), nickel (9.3 ppm) and indium antimonide (5.05 ppm). Also this layer had a thickness of 11 to 15 Angstrom (1.1-1.5 nm).

On the metal layer was applied an adhesive layer or adhesive consisting of a thermally curable polyester. Next, an embedding layer was applied, consisting also of PET and with a thickness of about 23 μm. The sandwich structure, consisting of two PET layers including in between the metal layers and the adhesive layer, was laminated using heat, such that the polyester adhesive layer was thermally cured.

On the side of the embedding layer, an acrylate adhesive layer of about 1.5 μm thick was applied by means of a micro engraving coating technique. This adhesive layer was further provided with a clear silicon PET stripping film.

On the other side of the laminated sandwich, next an acrylic clear hard coating was applied, by means of an engraving coating technique, which was cured with infra-red radiation.

In this example, two additional films were manufactured, with the metal concentrations according to Table 1.

TABLE 1

| Metal (ppm by weight) | Film 2 | Film 3 |
|---|---|---|
| Silver (Ag) | 30.00 | 39.6 |
| Chromium (Cr) | 1.60 | 9.50 |
| Nickel (Ni) | 18.60 | 20.80 |
| Zinc (Zn) | 3.00 | 17.20 |
| Antimony (Sb) | 7.10 | 6.80 |
| Indium (In) | 3.00 | 2.70 |

Example 2

A window with double glazing was coated on the inside for about half of its surface with the plastics film 1 of example 1. With an infra-red camera the temperature of the interior surface was measured. Where the film was applied, a temperature of about 23.4° C. was measured, whereas the glass surface without film had a temperature on its surface of about 18.6° C. This experiment shows the effectiveness of the film for reflecting long wavelength heat radiation, and therefore the heat-isolating effect.

Example 3

Two glass surfaces were provided with a layer of respectively plastics films film 2 and film 3 of example 1. Of these glass surfaces, the Shielding Effectiveness (SE) for electromagnetic radiation was measured with a TEM-t cell according to ASTM D4935, over the frequency range of 10 MHz to 1 GHz. The results of this determination allow to predict the behaviour of these films under the conditions of IEEE 299 or some other standards.

Figure 1:
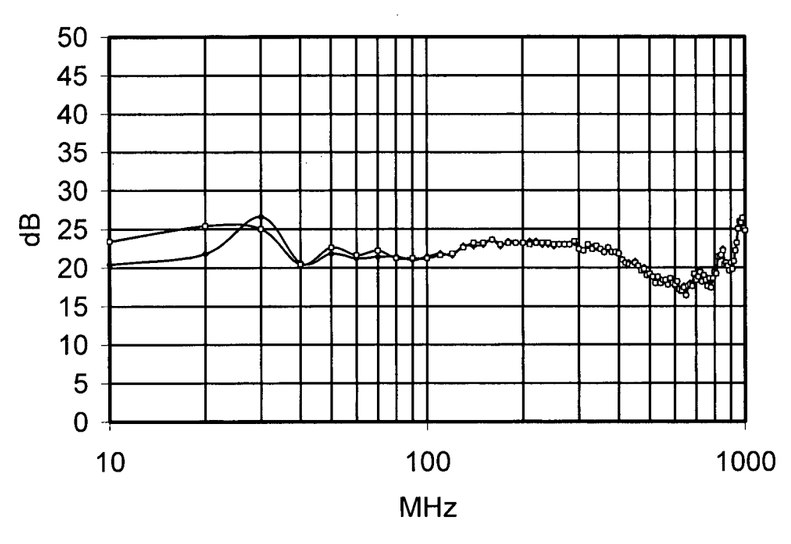
FIG. 1 shows the damping factor for electromagnetic radiation, measured for two films according to the invention, over a wide frequency range.

The results are shown in FIG. 1. For the major part of the tested frequency range, an SE or damping factor was measured of at least 20 dB. The SE even increased to more than 25 dB at frequencies of 20-30 MHz, and also at frequencies of 120-170 MHz. Only at frequencies between 180 and 700 MHz, a slightly lower SE was measured of nevertheless still at least 17 dB. The average damping value over the entire frequency range equaled 22 dB. These results are considerable, if one realises that a damping of 20 dB leads to a reduction of the electromagnetic field strength of 90%, and a reduction of the still existing electromagnetic capacity of 99%, and that a damping by the tested films is at least equivalent to, and even higher than, the damping by a stone wall or by reinforced concrete.

Now that the invention above has been completely described, the skilled person will understand that the invention can be carried out within a wide range of parameters within what has been described in the following claims, without deviating from the gist and the scope of the invention. The skilled person will understand that the invention, as it is determined by the claims, generally also comprises other embodiments which have not been specifically disclosed in this document.

The invention claimed is:

1. Energy-shielding plastics film, suitable for application on a surface selected from a transparent and a translucent surface, and which is at least 50% transparent for visible light, meaning the wavelength range ranging from 380 to 780 nm and measured according to the standard NBN EN 410, characterized in that the film comprises at least one plastic carrier layer with, on top thereof, a metallic layer comprising nickel and further comprising at least one element selected from antimony and arsenic together with at least one element selected from indium and gallium, the metallic layer being applied by sputter deposition, wherein the plastics film contains at least 10 ppm and at most 50 ppm by weight of nickel and further contains a total of indium (In), gallium (Ga), antimony (Sb) and arsenic (As) together, which are present as indium antimonide, indium gallium antimonide, gallium antimonide, indium arsenide, indium gallium arsenide and/or gallium arsenide, of at least 4.0 ppm by weight and at most 25.0 ppm by weight, wherein the concentrations are expressed relative with respect to the weight of the whole of the plastics film including all its layers, except for a protective film for an adhesive layer.

2. The plastics film according to claim 1 wherein the metallic layer further comprises at least one metal selected from the group consisting of tin, aluminium, and combinations thereof.

3. The plastics film according to claim 1, the metallic layer further comprising at least one additional metal, in a form selected from the group consisting of metal, a metal alloy, a metal oxide and other metal compounds, whereby said at least one additional metal is selected from the group of metals which appear in the IUPAC periodic table of the elements, the version of 22 Jun. 2007 and wherein the element groups are numbered from 1 up to and including 18, in the groups indicated with numbers 3, 4, 5, 6, 10, 11, 12, 13 and 15, the at least one additional metal excluding antimony, indium, arsenic and gallium.

4. The plastics film according to claim 3, wherein the at least one additional metal is selected from the group consisting of silver (Ag), chromium (Cr), zinc (Zn) and combinations thereof.

5. The plastics film according to claim 1, wherein the metallic layer is formed as one homogeneous layer.

6. The plastics film according to claim 1, wherein the metallic layer is formed as at least two metallic sublayers each with a different composition.

7. The plastics film according to claim 3, wherein the metallic layer comprises a sublayer that includes silver (Ag).

8. The plastics film according to claim 7, wherein the metallic layer comprises at least three sublayers and in which the sublayer that includes silver (Ag) is sandwiched between the other two sublayers.

9. The plastics film according to claim 1, wherein the metallic layer has a thickness of at least 1 nm.

10. The plastics film according to claim 1, wherein the metallic layer has a thickness of at most 50 nm.

11. The plastics film according to claim 1 wherein the metallic layer on its free side, which is the side not engaged with the plastic carrier layer, is protected with a plastic embedding layer.

12. The plastics film according to claim 11, wherein the plastic embedding layer has a thickness of 10-50 μm.

13. The plastics film according to claim 11, wherein the plastics for the embedding layer is based on a transparent thermoplastic material.

14. The plastics film according to claim 1, wherein the plastic carrier layer has a thickness of 10-50 μm.

15. The plastics film according to claim 1, further including an adhesive layer.

16. The plastics film according to claim 15, wherein the adhesive layer is covered with a plastic protective film.

17. The plastics film according to claim 15, wherein the adhesive layer is provided with a plastic protection layer.

18. The plastics film according to claim 1, further including a plastic protection layer.

19. The plastics film according to claim 1, wherein the plastic carrier layer includes a transparent thermoplastic material.

20. The plastics film according to claim 1, including at least one of the following features (a) through (j) wherein concentrations are expressed relative to the weight of the entire plastics film including all layers except for a protective film for an adhesive layer:
   a. comprising silver (Ag) at a concentration of at least 5 ppm by weight,
   b. comprising silver (Ag) at a concentration of at most 100 ppm by weight,
   c. comprising chromium (Cr) at a concentration of at least 0.50 ppm by weight,
   d. comprising chromium (Cr) at a concentration of at most 30 ppm by weight,
   e. comprising nickel (Ni) at a concentration of at least 15 ppm by weight,
   f. comprising nickel (Ni) at a concentration of at most 40 ppm by weight,
   g. comprising zinc (Zn) at a concentration of at least 0.50 ppm by weight,
   h. comprising zinc (Zn) at a concentration of at most 30 ppm by weight
   i. comprising at least one element selected from antimony (Sb) and arsenic (As) at a concentration of at least 3.00 ppm by weight, and
   j. comprising at least one element selected from antimony (Sb) and arsenic (As) at a concentration of at most 15 ppm by weight.

21. The plastics film according to claim 1, which contains a total of indium (In), gallium (Ga), antimony (Sb) and arsenic (As), as indium antimonide, indium gallium antimonide, gallium antimonide, indium arsenide, indium gallium arsenide and/or gallium arsenide, of at least 5.0 ppm by weight.

22. The plastics film according to claim 1, which contains a total of indium (In), gallium (Ga), antimony (Sb) and arsenic (As), as indium antimonide, indium gallium antimonide, gallium antimonide, indium arsenide, indium gallium arsenide and/or gallium arsenide, is at most 22.0 ppm by weight.

23. The plastics film according to claim 1, which contains a total of metals in a concentration of at most 250 ppm by weight, wherein the concentration is expressed relative to the weight of the entire plastics film including all layers except for a protective film for an adhesive layer.

24. A glass plate with applied thereon the plastics film according to claim 1.

25. The glass plate of claim 24 positioned in at least one of a vehicle, a vessel, and a building.

26. A method for the production of the plastics film according to claim 1, the method comprising the step of applying the metallic layer on the plastic carrier layer by sputter deposition.

27. The method according to claim 26, whereby the metallic layer is applied by DC magnetron sputtering deposition.

28. The method according to claim 26, the metallic layer further comprising applying at least one additional metal, in a form selected from a metal, a metal alloy, a metal oxide and other metal compounds, wherein the said least one additional metal is selected from the group of metals which appear in the IUPAC periodic table of the elements, the version of 22 Jun. 2007 and wherein the element groups are numbered from 1 to and including 18, in the groups indicated with numbers 3, 4, 5, 6, 10, 11, 12, 13 and 15, the at least one additional metal excluding antimony, indium, arsenic and gallium.

29. The method according to claim 28, wherein said additional metal is selected from the group consisting of silver (Ag), chromium (Cr), zinc (Zn), and combinations thereof.

30. The method according to claim 26, and further including laminating an embedding layer onto the metallic layer.

31. The method according to claim 26, further comprising the steps of:
   a. applying an adhesive layer, and
   b. applying a protective film on said adhesive layer.

32. The method according to claim 31, further comprising the steps of:
   a. removing the protective film, and
   b. applying the plastics film with its adhesive layer on a surface selected from a translucent and a transparent surface.

33. The method according to claim 32, further comprising the step of integrating the surface in an object.

34. The method according to claim 33, wherein the object is selected from the group of a vehicle, a vessel, and a building.

* * * * *